(12) United States Patent
Artigue et al.

(10) Patent No.: US 8,100,337 B2
(45) Date of Patent: Jan. 24, 2012

(54) DOUBLE INTERFACE COMMUNICATION ELECTRONIC MODULE, IN PARTICULAR FOR A CHIP CARD

(75) Inventors: Olivier Artigue, La Valette du Var (FR); Henri Boccia, Belcodene (FR); Olivier Brunet, Marseilles (FR)

(73) Assignee: Smart Packaging Soultions (SPS), Rousset (FR)

( * ) Notice: Subject to any disclaimer, the term of this patent is extended or adjusted under 35 U.S.C. 154(b) by 710 days.

(21) Appl. No.: 12/065,439

(22) PCT Filed: Aug. 28, 2006

(86) PCT No.: PCT/FR2006/002012
§ 371 (c)(1),
(2), (4) Date: Jun. 12, 2008

(87) PCT Pub. No.: WO2007/026077
PCT Pub. Date: Mar. 8, 2007

(65) Prior Publication Data
US 2008/0245879 A1    Oct. 9, 2008

(30) Foreign Application Priority Data

Aug. 30, 2005 (FR) ..................................... 05 08860

(51) Int. Cl.
*G06K 19/06* (2006.01)
(52) U.S. Cl. ........................................ 235/492; 235/487
(58) Field of Classification Search .................. 235/492, 235/487, 441; 361/737
See application file for complete search history.

(56) References Cited

U.S. PATENT DOCUMENTS 6,142,381 A * 11/2000 Finn et al. ...................... 235/492
(Continued)

FOREIGN PATENT DOCUMENTS

DE          196 32 115 C1      12/1997
(Continued)

OTHER PUBLICATIONS

Form PCT/ISA/210 (International Search Report) dated Feb. 13, 2007.

(Continued)

*Primary Examiner* — Ahshik Kim
(74) *Attorney, Agent, or Firm* — Buchanan Ingersoll & Rooney PC

(57) ABSTRACT

The invention concerns an electronic module (11) with double communication interface, in particular for a chip card, the said module comprising firstly a substrate (27) provided with an electrical contact terminal block (17) allowing functioning by contact with the contacts of a reader, and secondly comprising an antenna comprising at least one turn (13) and whose terminals are connected to the terminals of a microelectronic chip situated on one face of the module (11).

This module (11) is characterised in that the antenna turns (13) are situated substantially outside the area covered by the electrical contacts (17), so that the electrical contacts of the terminal block do not constitute electromagnetic shielding for the signals intended for the antenna.

The invention applies in particular to the production of chip cards with double communication interface with contact and without contact.

11 Claims, 3 Drawing Sheets

U.S. PATENT DOCUMENTS

| | | | |
|---|---|---|---|
| 6,310,778 B1 | 10/2001 | Finn et al. | |
| 6,390,375 B2 * | 5/2002 | Kayanakis | 235/492 |
| 6,568,600 B1 * | 5/2003 | Carpier et al. | 235/492 |
| 6,634,564 B2 * | 10/2003 | Kuramochi | 235/492 |
| 6,719,206 B1 | 4/2004 | Bashan et al. | |
| 6,851,618 B2 * | 2/2005 | Halope | 235/492 |
| 6,867,981 B2 * | 3/2005 | Murohara | 361/737 |
| 2002/0089049 A1 | 7/2002 | Leduc et al. | |
| 2003/0155420 A1 * | 8/2003 | Morrow et al. | 235/449 |
| 2005/0066513 A1 * | 3/2005 | Kayanakis et al. | 29/592.1 |
| 2006/0054709 A1 * | 3/2006 | Lee | 235/492 |

FOREIGN PATENT DOCUMENTS

| | | |
|---|---|---|
| EP | 0 875 039 B1 | 11/1998 |
| EP | 1 031 939 B1 | 8/2000 |
| FR | 2 765 010 A1 | 12/1998 |

OTHER PUBLICATIONS

Form PCT/IPEA/409 (International Preliminary Report on Patentability) dated Dec. 12, 2007.

* cited by examiner

DOUBLE INTERFACE COMMUNICATION ELECTRONIC MODULE, IN PARTICULAR FOR A CHIP CARD

FIELD OF THE INVENTION

The invention concerns an electronic module with double communication interface, in particular for a chip card, the said module comprising firstly a substrate provided with an electrical contact terminal block allowing functioning by contact with the contacts of a reader, and secondly comprising an antenna formed from at least one turn, and the terminals of which are connected to the terminals of a microelectronic chip situated on one face of the module.

The invention also concerns a chip card with double communication mode with a reader, namely a contact mode and a contactless mode, for using a module according to the invention.

BACKGROUND OF THE INVENTION

There also exist, in the prior art, chip cards with mixed functioning with contact and without contact, also referred to as "dual interface" cards in English terminology. The majority of these cards have a microelectronic module provided with contacts, the said module having a radio frequency communication interface connected to the terminals of an antenna that is itself produced in the card body, rather than on the module itself.

Thus the double communication interface cards according to the prior art consist of:
- an electronic module comprising the chip, the contact-type connection terminal block situated on the front face, and two contacts situated on the rear face allowing connection to the antenna,
- a plastic card, comprising an antenna,
- an electrically conductive material allowing connection between the electronic module and the antenna.

This structure in general procures a good communication range in operation, because of the large size of the antenna, but proposes a series of problems in producing the mechanical and electrical connection between the antenna and the module, causing losses of reliability or efficiency in manufacture.

These cards are generally manufactured according to the following steps:
- manufacturing the card body comprising an antenna. These antenna can be manufactured using known methods using incrusted copper wires, either conductive ink printing or the etching of copper on the internal material of the card body,
- manufacturing the electronic micromodule comprising contacts on a first and on the second face, the chip and connection points for the antenna,
- machining, in the card body, the cavity for housing the electronic micromodule, whilst baring the connection surfaces of the antenna situated inside the card body,
- bonding the electronic micromodule, establishing electrical connection between it and the bared connection areas of the antenna.

This connection can be obtained by known methods, such as the dispensing of conductive adhesive that will then be polymerised, the use of conductive adhesive or pastes in an anisotropic fashion (in the thickness), or the use of a polymer spring deposited on the micromodule (compressible projecting conductive stud).

These methods of manufacturing this type of card currently pose the following problems:
- the need to manufacture specific card bodies for "dual interface" cards, comprising an antenna and therefore giving rise to complex manufacturing methods,
- the need to machine the card bodies, baring the antenna surfaces, which reduces manufacturing efficiency,
- the use of a specific method of bonding the electronic micromodule in the specific card allowing electrical interconnection of the micromodule and antenna.

These methods are often very slow in comparison with the methods generally used for standard chip cards, and cause additional losses in manufacturing efficiency.

The methods of interconnection between module and antenna used consequently greatly limit the reliability of the final card. This is because the mechanical and thermal stresses inflicted on the card during its use gives rise to breaks in connection, or significant increases in the electrical resistance of this connection, giving rise to a loss of performance of the card during use.

Thus this type of card cannot be guaranteed over a very long period of use (greater than five years for example), which limits the applications available for this type of card.

To mitigate these manufacturing problems, it has been thought to integrate the antenna directly on the microelectronic module, and then to simply transfer the module into a chip card body, which is easy to achieve at low cost and with great reliability, with the majority of inserting machines for manufacturing chip cards.

Such a design is described in EP 0 875 039 B1, in relation to its FIG. 6A/6B which is reproduced below (FIGS. 1A and 1B of the present patent application). As will be described more amply below, this known design simplifies manufacture and makes it more reliable, but introduces a new problem compared with the previous technology with the antenna in the card body. This is because the module described in this document presents a problem of degraded functioning in contactless mode, because the module antenna is produced on one face of the module, whilst the electrical contacts are produced on the other face of the module, directly opposite the antenna. Because of this, the electrical contacts being metallic, they interfere with the electromagnetic flux between the reader and the antenna, to the point of greatly degrading the contactless communication capacity of the module.

SUMMARY OF THE INVENTION

One aim of the invention is consequently to propose an electronic module with double communication interface with contact and without contact, which does not have the aforementioned drawbacks.

Another aim of the invention is to propose a chip card with double communication interface, using an electronic module according to the invention and having good communication capacity in contactless mode, despite great compactness of the module and antenna.

Another aim of the invention is to propose a microelectronic module with double communication interface, in particular for a chip card, and a chip card using such a module, having very great reliability and great longevity, around five to ten years.

To this end, the invention provides for an electronic module with double communication interface, in particular for a chip card, the said module comprising firstly a substrate provided with an electrical contact terminal block allowing functioning by contact with the contacts of a reader and comprising secondly an antenna provided with at least one turn and whose terminals are connected to the terminals of a microelectronic chip situated on one face of the module, characterised in that the turns of the antenna are situated substantially outside the area covered by the electrical contacts. In this way, the electrical contacts of the terminal block do not constitute an electromagnetic shielding for the signals intended for the antenna and the functioning of the module in contactless mode is greatly improved thereby.

Preferably, the electrical contacts of the terminal block are situated on one face of the substrate, and the turns of the antenna are situated on the opposite face.

Advantageously, the turns of the antenna are situated at the periphery of the module and the electrical contacts of the terminal block are situated outside the area delimited by the turns of the antenna. Thus the electromagnetic flux picked up by the turns of the antenna is maximum, which favourably influences the range of contactless communication with the reader. In this embodiment, the electrical contacts of the contact terminal block are preferably arranged so as to be in accordance with ISO 7816-2.

However, the reverse embodiment of the invention is possible; the electrical contacts of the terminal block are then situated at the periphery of the module and the turns of the antenna are situated towards the centre of the module, inside the area delimited by the contacts.

Advantageously, the turns of the antenna are situated on the same side of the substrate as the microelectronic chip and the electrical contacts of the terminal block are situated on the opposite face of the substrate.

According to a particularly advantageous embodiment of the invention, taking into account reliability of manufacture, the module has a plurality of protuberances situated outside the area covered by the contacts and opposite the turns of the antenna. In an embodiment where the antenna is at the periphery of the contact area, the protuberances are also produced at the periphery of the contacts, opposite the turns of the antenna, on the face of the substrate opposite to that carried by the turns of the antenna, so that the protuberances overhang the area of the antenna turns. Thus the pressure applied to the module during the integration of the module in the cavity of the card body of a chip card is relayed by the protuberances as far as the bonding area between the module and the card body, which guarantees good-quality bonding.

These protuberances are preferably metallic and are produced in a very economic fashion during the phase of producing the electrical contacts of the terminal block.

They have for example substantially the form of radii extending from the electrical contacts of the terminal block towards the periphery of the module.

Naturally, in the case where the protuberances are metal, their total surface area must be small compared with the surface area of the contacts of the terminal block, in order not to reintroduce electromagnetic interference, which the novel structure of the module has precisely made it possible to eliminate.

Another object of the invention is a chip card that comprises an electronic module as described above.

In a variant of this chip card it also comprises, in its card body, a device for concentrating or amplifying electromagnetic waves, able to channel the electromagnetic flux towards the turns of the antenna.

BRIEF DESCRIPTION OF THE DRAWINGS

Other characteristics and advantages of the invention will emerge from a reading of the detailed description and accompanying drawings, in which.

DETAILED DESCRIPTION OF THE DRAWINGS

Figure 1A:
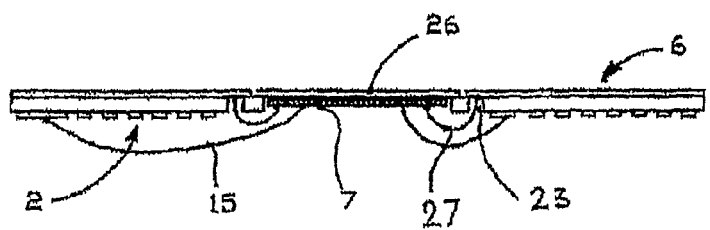
FIG. 1A illustrates a view in section of an electronic module according to the prior art in accordance with EP 0 875 039 B1.
Figure 1B:
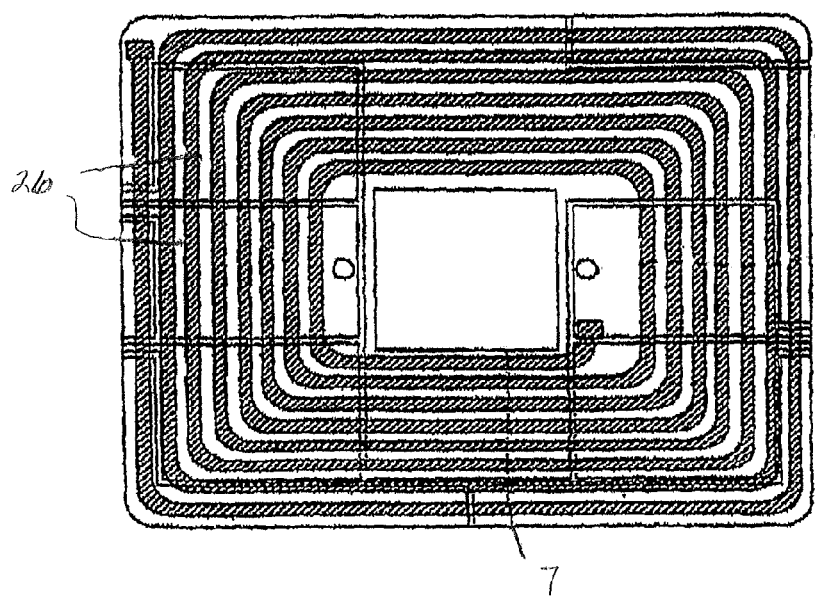
FIG. 1B illustrates a plan view of the module of FIG. 1A.

As indicated above, FIGS. 1A/1B show a double-interface electronic module in accordance with the prior art. The numerical references in FIGS. 1A and 1B are those of the prior document. It can be seen clearly that the chip (denoted 7) is connected to an antenna (denoted 2) whose turns surround the chip. Moreover, as visible in FIG. 1A, the electrical contacts (denoted 26) overhang the antenna and are separated from it only by a thin substrate. Thus the electromagnetic field that reaches the antenna is necessarily disturbed by the electrical contacts, which degrades the functioning of this type of module in contactless mode.

Figure 2:
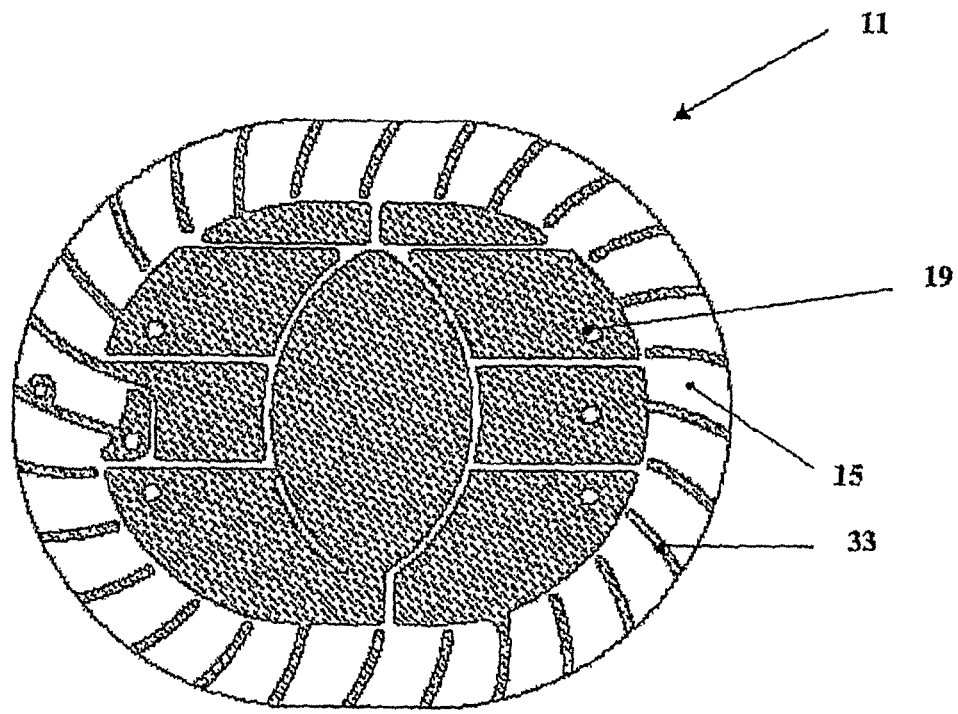
FIG. 2 illustrates a plan view of an electronic module according to the invention.
Figure 3:
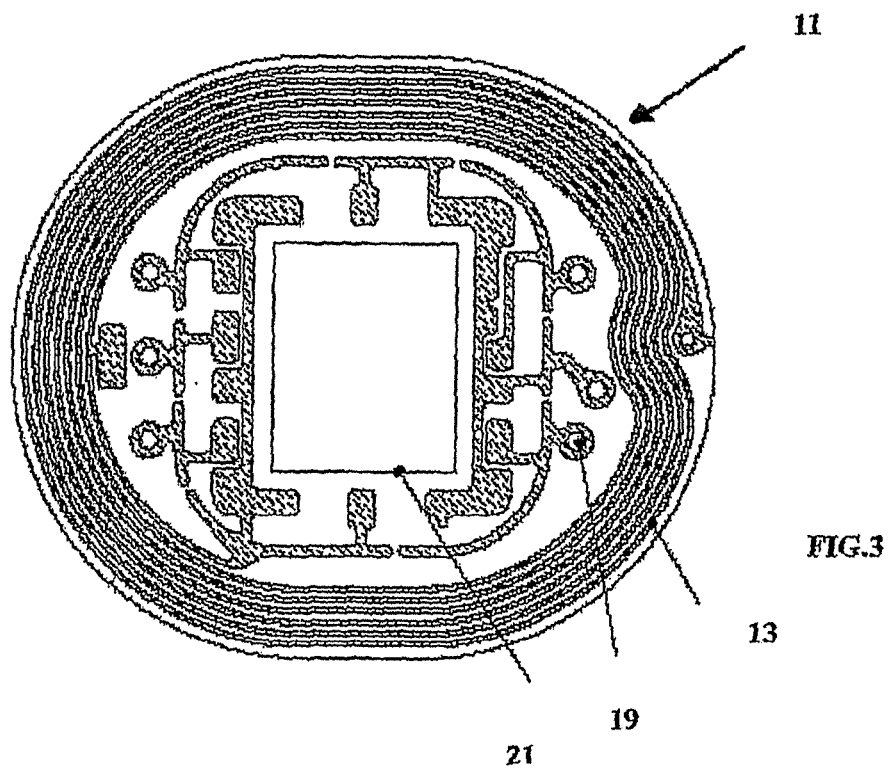
FIG. 3 illustrates a view from below of the module in FIG. 2.

Reference is made to FIGS. 2 and 3. These figures show an electronic module 11 according to the invention, in plan view (FIG. 2), that is to say a view from the side of the contacts, and in view from below (FIG. 3), that is to say here a view from the side of the substrate not carrying the electrical contacts.

To remedy the problems of electromagnetic interference between the contacts and antenna as described above, the engineers of the applicant found a novel module structure 11, in which the turns 13 of the antenna are attached at the periphery 13 of the module, in an area where they are situated neither below nor above the electrical contacts 17 but substantially outside the area delimited by the contacts.

In a variant, the electrical contacts 17 can be disposed at the periphery of the module 11, and in this case the antenna turns will be disposed in the central area of the module, still outside the area of the contacts.

The wells or vias 19 that make it possible to electrically connect the contacts of the chip (not shown) to the corresponding contacts of the terminal block 17 of the module 11 have also been shown. The location reserved for the bonding of the chip is denoted 21 in FIG. 3.

This novel structure has the advantage of minimising or even eliminating the effects of electromagnetic shielding of the contacts 17 with regard to the antenna turns 13.

Figure 4:
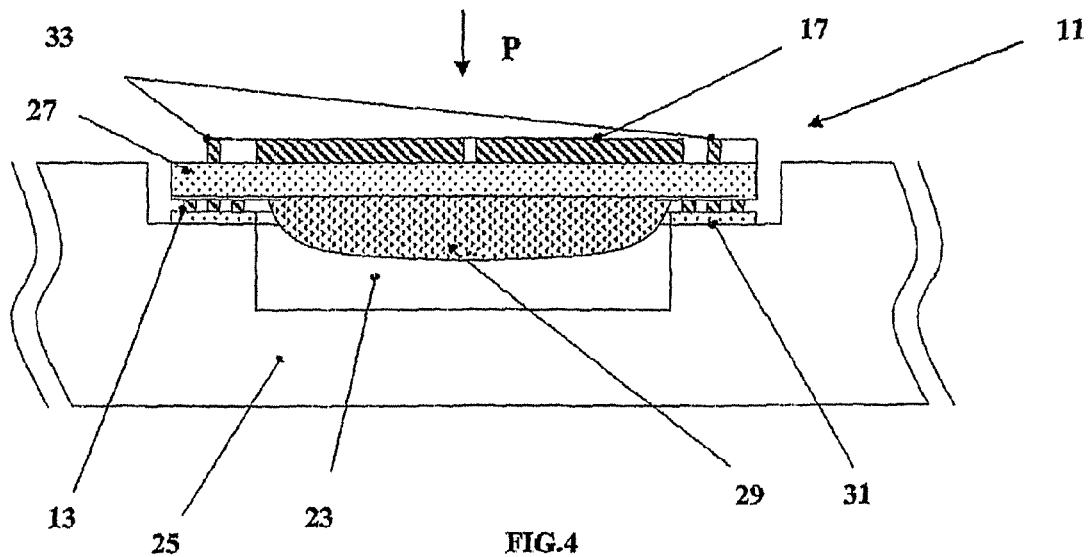
FIG. 4 illustrates a view in section of the module in FIGS. 3 and 4.

Reference is made to FIG. 4. The module 11 is shown in this figure with its substrate 27, carrying the chip (not shown) on its face oriented downwards. The chip is here hidden since it is enclosed in a drop of coating resin 29. The antenna 13 is situated at the periphery of the module 11, on the side of its chip and its coating resin 29, and extends around the chip. According to the invention, the antenna extends out of the central area of the module, which is covered by the contacts 17 on the opposite face (here the top face) of the module 11.

When the chip card is assembled, the module 11 is attached facing a cavity 23 provided in the card body 25. The cavity 23 is provided with an area coated with an adhesive 31. The module 11 is attached in the cavity as shown, the antenna turns coming in contact with the adhesive 31. There then follows a step of pressing on the top face of the module 11 in order to ensure good-quality bonding of the module 11 in the cavity 23.

However, it is possible that the structure of the module according to the invention may make the manufacture of the module, and in particular this pressing step, a little more tricky, as can easily be understood in the view in section of FIG. 4. This is because the presser (represented simply by its action line P) acts on the whole of the top surface of the module. As the turns 13 of the antenna are situated outside the area of the contacts 17, there is no direct pressing action in the area situated above the turns 13 of the antenna and consequently there is potentially a risk of flexion of the substrate 27, or at least of a less good quality bonding between the turns 13 and the adhesive 31, which would impair the liability of the bonding and the longevity of the card.

To remedy this risk, the invention provides, in an even more advantageous variant, a plurality of protuberances 33 situated on the same side as the electrical contacts 17 but in the area which overhangs the antenna turns 13.

Thus, in the embodiment with the turns 13 at the periphery of the module, the protuberances 33 are also at the periphery of the module 11, on the same side as the contacts 17 and above the antenna turns 13. These protuberances 33 have their top face situated at the same height as the top face of the contacts 17, so that the pressing tool transmits the pressing force at the same time on the contacts and on the protuberances 33, the pressing force being thus transmitted to the area of bonding of the turns 33 on the adhesive 31, without flexions or deformations of the module being able to appear.

This solution is of course easily adaptable to the variant of the module that comprises electrical contacts at the periphery and the antenna disposed in the central area of the module.

Advantageously and in a particularly simple fashion, the invention makes provision for producing the protuberances 33 from the metallisation of the contacts 17, for example by chemical etching when the electrical contacts 17 are produced. The form of the protuberances 33 will easily be determined by a person skilled in the art. It is possible to give the protuberances 33 the form of slightly curved radii, as depicted in FIG. 2. In addition, for the case where the protuberances 33 are metal (like the contacts 17), it will be useful to minimise their surface area as much as possible. This is because they are situated in the area overhanging the antenna turns 13 and their surface area must be relatively small compared with the non-metallised surface, in order to minimise any electromagnetic interference with the antenna. A person skilled in the art will easily be in a position to optimise the surface area of the protuberances compared with the free surface of metal, in order to optimise the electromagnetic flux picked up by the antenna 10 whilst allowing sufficient pressing of the module against the card body when the module is inserted.

Figure 5:
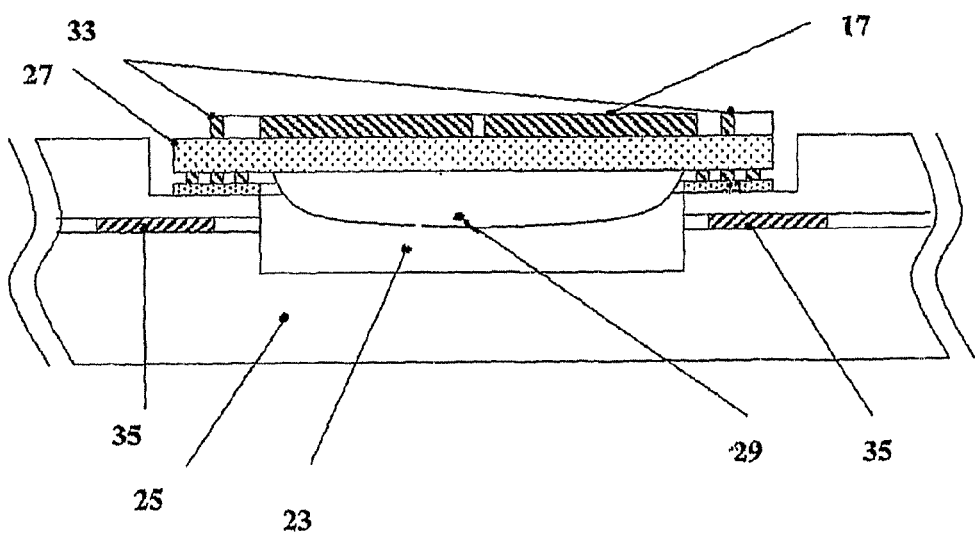
FIG. 5 illustrates a view in section of a variant of the module according to the invention.

Reference is now made to FIG. 5, in which a supplementary variant of the invention has been shown, in which there has been incorporated in the card body 25 a resonant circuit 35 located on all or part of the card body. This resonant circuit, which can in particular consist of a simple metal sheet, has R, L, C characteristics able to channel the electromagnetic field received by the card body, towards the antenna 13, so as to improve further the quality of functioning of the chip card in contactless mode.

Thus the card intended to receive the module can advantageously receive a device for concentrating or amplifying electromagnetic waves, in particular of the R, L, C circuit type, able to channel the electromagnetic flux to the turns of the antenna. This will allow an improvement in the performance of the final card. It should be noted that, in this configuration of the invention, no electrical connection between the electronic module and this amplification device needs to be made, which makes it possible to keep all the advantages relating to reliability and the methods of bonding the module according to this invention.

In the end, the invention proposes a particular design allowing optimum functioning of the dual interface module, designed so as to allow electromagnetic flux to pass inside the antenna without being disturbed by the metallisations of the contacts, which enables the antenna to react to this flux, in order to provide sufficient energy for the radio frequency communication of the chip.

The electronic module of the invention requires no electrical connection with the card body, and standard inserting methods can be used, which gives rise to a gain in manufacturing rate and an increase in manufacturing efficiency and reliability. This makes it possible to apply this technology to very severe terrain applications, or those with a very long service life, such as for example the application to identity cards or electronic passports, for which government offices in general require a guarantee of good withstand strength and good functioning for ten years.

The invention claimed is:

1. An electronic module with double communication interface, for a chip card, said module comprising:
 a substrate including an electrical contact terminal block allowing functioning by contact with the contacts of a reader; and
 an antenna including at least one turn upon a surface of the electronic module and whose terminals are connected to the terminals of a microelectronic chip situated on one face of the module,
 wherein the at least one turn of the antenna is situated upon a first area of the surface of the electronic module substantially outside a second area covered by the electrical contacts, said module having a plurality of protuberances situated outside the area of electrical contacts of the terminal block, on a face of the substrate opposite to that which carries the antenna turns.

2. An electronic module according to claim 1, wherein the protuberances are situated at the periphery of the electronic module and overhang the area of the antenna turns.

3. An electronic module according to claim 2, wherein the protuberances are metallic and are produced during the phase of producing the electrical contacts of the terminal block.

4. An electronic module according to claim 3, wherein the protuberances are substantially in the form of radii extending from the electrical contacts of the terminal block towards the periphery of the module, the total surface area of the protuberances being small compared with the surface area of the contacts of the terminal block.

5. An electronic module according to claim 1, wherein the electrical contacts of the terminal block are situated on one face of the substrate, and wherein the antenna turns are situated on the opposite face of the substrate.

6. An electronic module according to claim 5, wherein the antenna turns are situated at the periphery of the module and wherein the electrical contacts of the terminal block are situated towards the center of the module, outside the area delimited by the antenna turns.

7. An electronic module according to claim 1, wherein the antenna turns are situated on the same side of the substrate as the microelectronic chip, the electrical contacts of the terminal block being situated on the opposite face of the substrate.

8. An electronic module according to claim 1, wherein the electrical contacts of the contact terminal block are arranged so as to be in accordance with ISO 7816-2.

9. An electronic module according to claim 1, wherein the electrical contacts of the terminal block are situated at the periphery of the module and wherein the antenna turns are situated towards the center of the module, outside the area delimited by the electrical contacts.

10. A chip card comprising an electronic module according to claim 1.

11. A chip card according to claim 10, further comprising, in the card body, a device for concentrating or amplifying electromagnetic waves, to channel the electromagnetic flux to the turns of the antenna.

* * * * *